United States Patent [19]

Jones et al.

[11] 4,194,233
[45] Mar. 18, 1980

[54] MASK APPARATUS FOR FINE-LINE LITHOGRAPHY

[75] Inventors: Addison B. Jones, La Mirada; David B. Wittry, Pasadena, both of Calif.

[73] Assignee: Rockwell International Corporation, El Segundo, Calif.

[21] Appl. No.: 873,307

[22] Filed: Jan. 30, 1978

[51] Int. Cl.² .............................................. H02N 13/00
[52] U.S. Cl. ..................................... 361/233; 269/20; 355/132
[58] Field of Search ........................ 361/233; 29/579; 269/20, 22; 355/91, 133, 132; 165/1

[56] References Cited

U.S. PATENT DOCUMENTS

| | | | |
|---|---|---|---|
| 4,007,987 | 2/1977 | Sheets | 355/91 |
| 4,026,653 | 5/1977 | Appelbaum et al. | 355/91 X |
| 4,054,383 | 10/1977 | Lin et al. | 355/91 |
| 4,139,051 | 2/1979 | Jones et al. | 165/1 |

FOREIGN PATENT DOCUMENTS 808764 2/1959 United Kingdom ..................... 361/233

*Primary Examiner*—J. D. Miller
*Assistant Examiner*—L. C. Schroeder
*Attorney, Agent, or Firm*—H. Fredrick Hamann

[57] ABSTRACT

There is described a unique apparatus which is especially useful with very thin masks used in X-ray lithography, transmission electron lithography or electron projection lithography. The apparatus includes temperature stabilization means for counteracting the deleterious effects in the mask caused by absorption of energy from the energy source as well as positioning means for precisely spacing thin masks for proximity lithography techniques. The thermal effects are counteracted by providing a chuck which supports the substrate to be acted upon. A thermally conductive layer, for example a fluid or other conformable medium, can be provided between the substrate and the chuck. The mask is similarly spaced from the substrate by a thin layer of thermally conductive material, for example, a low pressure gas which is capable of passing the energy in question. The precise spacing of the mask is controlled by the use of a source which establishes an electrostatic charge between the substrate and the mask. The charge may be provided by a source connected to the substrate and mask or by means of filaments disposed above the mask. Precise spacing is achieved by balancing the attractive force of the electrostatic charge with the repulsive force of the low pressure gas.

13 Claims, 1 Drawing Figure

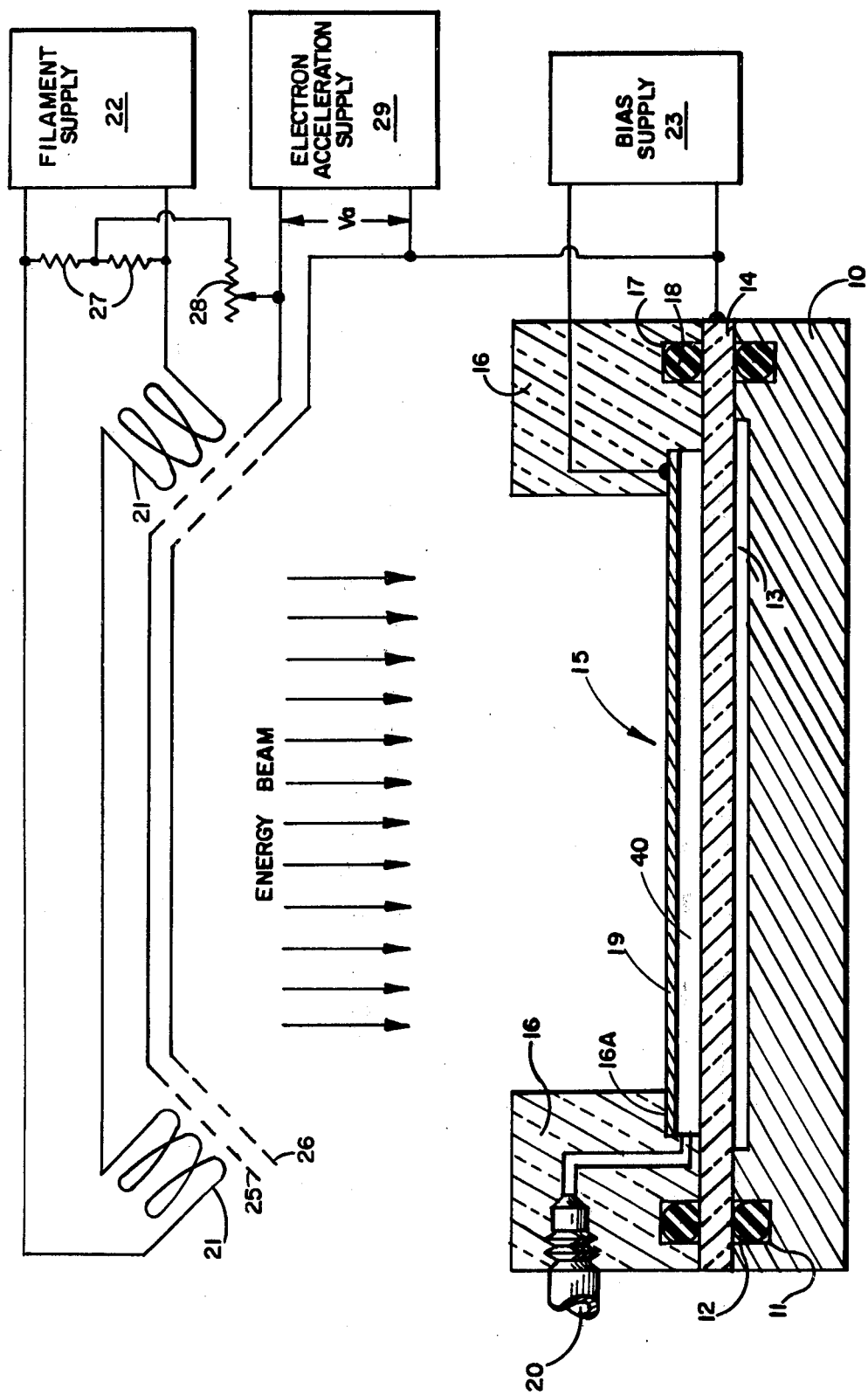

MASK APPARATUS FOR FINE-LINE LITHOGRAPHY

BACKGROUND OF THE INVENTION

1. Field of the Invention

This invention is directed to an apparatus, in general, which is used for fine-line lithography. In particular, the invention is directed to an improved apparatus which provides thermal and spacing control for a thin mask.

2. Prior Art

In the era of circuit microminiaturization, fine-line lithography is a fundamental fabrication requirement. High resolution lithography is useful in many technical areas such as in the fabrication of magnetic bubble domain devices, semiconductor device, MOS/LSI devices and the like. Many other technological areas are rapidly adopting the techniques of fine-line lithography.

Lithography employing exposure sources other than near U.V. lamps is a known and developing art. In using this type of lithography, various energy sources such as X-ray sources, electron sources and the like are utilized. In the past, these sources have been used with contact or projection techniques. It has been determined that proximity-type masking is more highly desirable than contact masking inasmuch as the mask life tends to be substantially prolonged using the proximity technique. However, it is also been found that use of proximity masks has required a relatively thick mask in order to withstand the problems encountered therewith. Of course, with the thicker mask, less resolution can be obtained with a fine-line lithography technique. Use of thin masks has, typically, been unsuccessful because thin masks tend to absorb energy and thus, heat. Also, thin masks become charged by the energy source. These problems (i.e. thermal and charge absorption) cause the mask to become distorted and, thus, unusable. Consequently, proximity mask techniques are not used significantly even though the advantages thereof are manifold.

PRIOR ART STATEMENT

The pertinent art which is best known to applicant is listed herewith.

1. U.S. patent application Ser. No. 810,469; High Resolution Mask and Method of Fabricating Thereof; Jones; filed June 27, 1977; Group No. 162.

2. U.S. Pat. No. 4,139,051; Method and Apparatus from Thermally Stabilizing Workpieces; Jones et al; filed Sept. 7, 1976; Group No. 142.

SUMMARY OF THE INVENTION

This invention is directed to an apparatus which is used with thin masks in proximity exposure lithography techniques. The apparatus comprises a thermal device for conducting heat away from the mask as well as providing a stable thermal base for the substrate being acted upon. A pressure layer is provided between the mask and the substrate to prevent the mask from touching the substrate and for conducting heat from the mask. In addition, means for providing an electrostatic field between the substrate and mask is provided to control the precise spacing of the mask relative to the substrate.

BRIEF DESCRIPTION OF THE DRAWINGS

The sole FIGURE is a partially cross-sectional, partially schematic view of a preferred embodiment of the instant invention.

DESCRIPTION OF A PREFERRED EMBODIMENT

Referring to the sole FIGURE, there is shown a cross-sectional view of the apparatus of the instant invention. Preferably, the apparatus is operated in a vacuum. A suitable source of energy is provided to produce an energy beam to be used in an operation. In this embodiment, there is provided chuck 10 which may be of any suitable temperature stabilized or thermally conductive type known in the art such as is shown and described in co-pending application Ser. No. 721,121 by Jones et al (noted supra). Chuck 10 includes annular groove 11 in the upper surface thereof and which substantially encompasses the periperhy of the chuck. O-ring or other suitable seal 12 is provided in groove 11. The upper surface of chuck 10 also includes recess 13 which, in this embodiment, embraces substantially all of the upper surface of chuck 10 within groove 11. Recess 13 is arranged to retain a thin layer of a suitable noncontaminating thermally conductive conforming material, such as a polymer, distilled water, silicone rubber of the like. The depth of recess 13 is sufficiently small to establish the thermal contact material as a thin film. Substrate 14 is positioned to overlie chuck 10 and to be placed in contact with O-rings 12 to form a vacuum-tight seal between substrate 14 and the upper surface of chuck 10. The substrate may be retained in any manner such as described in the co-pending application of Jones et al noted supra or simply by direct pressure of the clamping means which is applied after mask alignment. Suitable clamping means (not shown) are provided to hold mask 15 in contact with substrate 14 and chuck 10 in order to produce sealing at O-rings 12 and 18.

Mask 15 is placed over substrate 14. Mask 15, such as described in co-pending application Ser. No. 810,469 by Jones (noted supra) includes a support member 16 which may be fabricated of quartz or the like. Support member 16 can be arranged around the periphery of mask 15. Groove 17 (which may be annular) is provided in the bottom surface of support member 16. O-ring 18 is inserted into groove 17 to provide a seal with the upper surface of substrate 14. The inner surface of support 16 may be recessed slightly such as shown at lip 16 A for receiving thin membrane masking material 19. Thin membrane 19 is affixed to the inner edges of support 16 in a suitable manner such as with epoxy cement or the like. Membrane 19 may be formed of any suitable material such as plastic film, parylene, formvar or an oxide film formed by anodizing, such as $Al_2O_3$. Typical area density of membrane 19 is 20 g/cm$^2$ or less in the thin mask embodiment. Mask 15 forms no portion of the invention, per se.

A suitable aperture 20 is provided in support member 16. Aperture 20 communicates with the outer edge of support 16 and the space between masking material 19 and the upper surface of substrate 14. Thus, a suitable thermally conductive, inert fluid (typically gaseous) material can be inserted into cavity 40 between membrane 19 and substrate 14 via aperture 20. Typically, the inert gas (such as Ar, He, Ne, N etc.) forms a thin layer with a pressure of between 10 and 100 microns.

Adjacent to the apparatus is disposed at least one suitable charging filament 21 which is connected to filament supply 22 across resistor 27. Bias supply 23 is connected between substrate 14 and mask membrane 19 through any suitable electrical connection apparatus. It should be noted that bias supply 23 or charging filaments 21 and associated supply 22 can be used separately or together.

A first grid-structure 25 is disposed between filaments 21 and the remainder of the apparatus. Grid 25 is connected to resistor 27 via variable resistor 28. In addition, grid 25 is connected to electron acceleration supply 29. These connections to grid 25 establish the potential at grid 25 relative to the voltage applied to filaments 21. Grid structure 26 can be disposed between grid 25 and the remainder of the apparatus. Grid 26 is also connected to supply 29 and provides a field-free space between the grids and mask membrane 19.

In operation, a film of distilled water or other thermally conductive and conformable material is provided between the substrate 14 and chuck 10 to provide a good thermal contact. This has the effect of maintaining the substrate at a relatively constant uniform temperature, irrespective of the amount of thermal energy applied thereto via the electron beam, X-ray beam or whatever energy source is applied. In addition, a thin layer of gas is provided between membrane 19 and substrate 14. The gas is a thermally conductive material used to conduct away the heat normally produced by the incident energy beam. It has been noted that the thermal conductivity of the thin layer of gas is independent of pressure down to about 100 milliTORR. This level of pressure should be sustainable by membrane 19 without rupture or excessive distortion. Nevertheless, with the arrangement shown, the substrate is maintained at a substantially constant temperature by chuck 10 and membrane 19 is cooled by the gas to maintain a substantially constant temperature also. In addition, the pressure of the gas layer can be controlled so that mask material 19 will bow slightly away from substrate 14 wherein the danger of scratching the mask or substrate is reduced.

In order to precisely control the position of membrane 19 to prevent excessive outward bowing (and, conversely, to prevent inward bowing as well) the electrostatic apparatus is utilized. That is, by applying an electrical signal from supply 22 to charging filaments 21, membrane 19 can also be charged to create an appropriate attractive force relative to substrate 14. That is, filaments 21 are heated sufficiently to emit electrons which produce a charge on the surface of membrane 19. Thus, the attractive force created in membrane 19 by charging filaments 21 is much greater than an attractive force which could be produced by the energy source. This attractive force can be maintained at a steady, constant level and can be balanced by the pressure of the cooling gas layer thereby providing a precisely reproducible spacing between the mask and the substrate for proximity exposure, even with a relatively large mask area. In addition, by providing this attractive force a slightly greater gas pressure can be exerted to increase the thermal conductivity thereof without the risk of rupture of membrane 19.

Filament supply 22 supplies a voltage to filaments 21 across resistor 27. Also, a voltage established by the IR drop across resistor 28 provides a voltage difference between grid 25 and filaments 21. This voltage controls the low energy electron current from grid 25 to substrate 14. Likewise, voltage $V_a$ (typically on the order of 100–2000 volts) is applied between grid 25 and substrate 14 to control the electron energy. By suitable choice of $V_a$, an insulating mask 19 can be operated at a positive, negative or zero potential relative to the substrate. This relative potential can be analyzed as a function of the secondary emission of electrons from substrate 14. Also, variable resistor 28 permits relatively sensitive and rapid control over the potential at grid 25 whereby accurate control of the charge relationship between mask 19 and substrate 14 can be maintained.

In the alternative, bias supply 23 can be connected between substrate 14 and support member 16 (and, thus, membrane 19). Bias supply 23 can be either AC or DC, as desired, to achieve the balancing attractive force between the mask and substrate. Typically, bias source 23 is used for masks and substrates fabricated of electrically conductive material while charging filaments 21 are used for insulating masks and substrates. Of course, there may be occasions when both charging concepts are equally useful.

Thus, there has been shown and described a preferred embodiment of an improved fine-line lithography apparatus. This apparatus permits the advantageous use of thin membrane mask devices. The apparatus shown and described includes specific recitations of structure. It is clear that modifications in the structure may be conceived by those skilled in the art which will permit the apparatus to function in the same general manner. Any such modifications, which fall within the purview of this description, are intended to be included therein. The description is intended to be illustrative only rather than limitative. In fact, the invention is limited only in accordance with the claims appended hereto.

Having thus described a preferred embodiment of the invention, what is claimed is:

1. Apparatus for supporting a substrate means to be operated upon, comprising
   chuck means for holding said substrate means,
   mask means disposed adjacent to said substrate means,
   first means for confining a first layer of thermally conductive conformable material between said mask means and said substrate means,
   second means for confining a second layer of thermally conductive, conformable material between said substrate and said chuck means, and
   charging means for establishing an electrical charge on said mask to produce a force field between said mask means and said substrate means,
   said first and second layers providing accurate positioning and thermal stabilization of said mask means.

2. The apparatus recited in claim 1 wherein
   said first means includes a cavity in said mask means, and
   said second means includes a cavity in said chuck means.

3. The apparatus recited in claim 1 wherein
   said first layer in said first means is of a gaseous nature.

4. The apparatus recited in claim 1 wherein
   said second layer in said second means is a thermally conductive liquid.

5. The apparatus recited in claim 3 wherein
   said gaseous layer exerts sufficient pressure to maintain said mask means spaced a prescribed distance apart from said substrate means.

6. The apparatus recited in claim 1 wherein said charging means includes filament means for emitting charged particles which are absorbed by said mask means to impart a charge thereto.

7. The apparatus recited in claim 1 wherein said charging means includes an electrical source connected between said mask means and said substrate means.

8. The apparatus recited in claim 6 including grid means disposed between said charging means and said mask means to control the charged particles emitted by said filament means.

9. The apparatus recited in claim 8 wherein said grid means includes first and second grids, said first grid disposed between said filament means and said second grid whereby said first grid controls the low energy electron current from said filament means and said second grid establishes a field free region between said grids and said mask means.

10. The apparatus recited in claim 8 including source means connected to said grid means to control the energy of electrons emitted by said filament means.

11. The apparatus recited in claim 1 wherein said mask means includes a relatively thin membrane.

12. The apparatus recited in claim 1 wherein second layer comprises a polymer material.

13. The apparatus recited in claim 1 wherein said charging means includes an electrical supply connected between said mask means and said substrate means.

* * * * *